(12) United States Patent
Troccolo et al.

(10) Patent No.: US 6,208,748 B1
(45) Date of Patent: Mar. 27, 2001

(54) MONITORING FOCUS OF A LENS IMAGING SYSTEM BASED ON ASTIGMATISM

(75) Inventors: Patrick M. Troccolo; Andrew Grenville, both of Portland, OR (US)

(73) Assignee: Intel Corporation, CA (US)

( * ) Notice: Subject to any disclaimer, the term of this patent is extended or adjusted under 35 U.S.C. 154(b) by 0 days.

(21) Appl. No.: 09/479,381

(22) Filed: Jan. 5, 2000

(51) Int. Cl.[7] .................................................. G06K 9/00
(52) U.S. Cl. ...................................... 382/100; 351/212
(58) Field of Search ................................ 351/205, 211, 351/212, 221; 382/100, 215, 287; 349/5; 250/372, 359.1, 461.1, 491.1; 356/386

(56) References Cited

U.S. PATENT DOCUMENTS

| | | | |
|---|---|---|---|
| 4,656,358 | * 4/1987 | Divens et al. | 259/372 |
| 5,014,326 | * 5/1991 | Turner et al. | 382/100 |
| 5,579,063 | * 11/1996 | Magnante et al. | 351/211 |

* cited by examiner

Primary Examiner—George Mannuel
(74) Attorney, Agent, or Firm—Fish & Richardson P.C.

(57) ABSTRACT

Methods for determining a focus position of a lens system based on astigmatism. The methods can be used to monitor the focus of the lens system or to determine the flatness of a surface.

23 Claims, 4 Drawing Sheets

MONITORING FOCUS OF A LENS IMAGING SYSTEM BASED ON ASTIGMATISM

BACKGROUND

This disclosure is related to imaging systems that use a lens system to project images, and more specifically, to monitoring focus errors of imaging systems.

An imaging system can be configured to use an optical lens system to project an image of an object onto an imaging surface. The lens system may include one or more lenses depending on the imaging requirements for the system. In many applications, the distances from the object to the lens system and from the lens system to the imaging surface are carefully selected so that the image is well focused onto the imaging surface to form a sharp image. An imaging system may use a focus module to control the focus of the lens system. A photolithographic imaging system in wafer processing is an example of such an imaging system. Any focus error may cause blurring of the image and can be undesirable. For example, a focus error can adversely reduce the resolution in image sensing devices or undesirably change the minimum feature size in photolithography.

An optical lens system may be characterized by a number of parameters, including its numerical aperture ("NA"), depth of focus ("DOF"), and minimum feature size ("W") at its imaging surface. Under illumination of radiation at a wavelength ($\lambda$), the minimum feature size due to the limit of diffraction is $$W \approx 0.6 \frac{\lambda}{NA}.$$

The depth of focus of this lens system can be expressed as $$DOF \approx \pm \frac{\lambda}{2(NA)^2}.$$

It is desirable to make the minimum feature W as small as possible while maintaining a robust image fidelity. In a photolithographic process, a line feature in a photomask for a positive photoresist is in its best focus when its imaged linewidth is as large as possible. The image of the same line feature in a photomask for a negative photoresist is in its best focus when the imaged linewidth is as small as possible. High imaging resolution is achieved by either increasing the numerical aperture NA or using a shorter wavelength $\lambda$. However, a large numerical aperture NA or a shorter wavelength $\lambda$ reduces the depth of focus so that any focus error is likely to cause significant blurring of the image. This therefore degrades the imaging resolution. Hence, a lens system may be optimized for the specific requirements of an application by selecting proper minimum feature size W and the depth of focus DOF.

The focus errors of an imaging system may be caused by various contributors which include, among others, the relative spacing between the lens system and the imaging surface, the relative spacing between the object and the lens system, and the non-flatness of the imaging surface. For example, in the exposure process of one type of photolithographic imaging systems such as a scanner lens system, the relative scanning motion between the wafer and the lens imaging system from one exposure to another may cause a variation or shift in the focus.

SUMMARY

The present invention includes a method for characterizing astigmatism of a lens system to determine a focus position. The imaged linewidths of line features are measured along a first orientation and a second orientation in a mask projected by a lens system at varying focus positions. The second orientation is orthogonal to the first orientation and the line features in the mask have an identical design width.

Next, the measured linewidths are subtracted to obtain a difference in linewidth at each focus position. The subtracted differences in linewidth and their respective focus positions are then represented by a function.

This method can be used to monitor the focus of the lens system and to determine the flatness of a surface.

BRIEF DESCRIPTION OF THE DRAWINGS

These and other aspects will now be described in detail with respect to the accompanying drawings, wherein.

DETAILED DESCRIPTION

Figure 1:
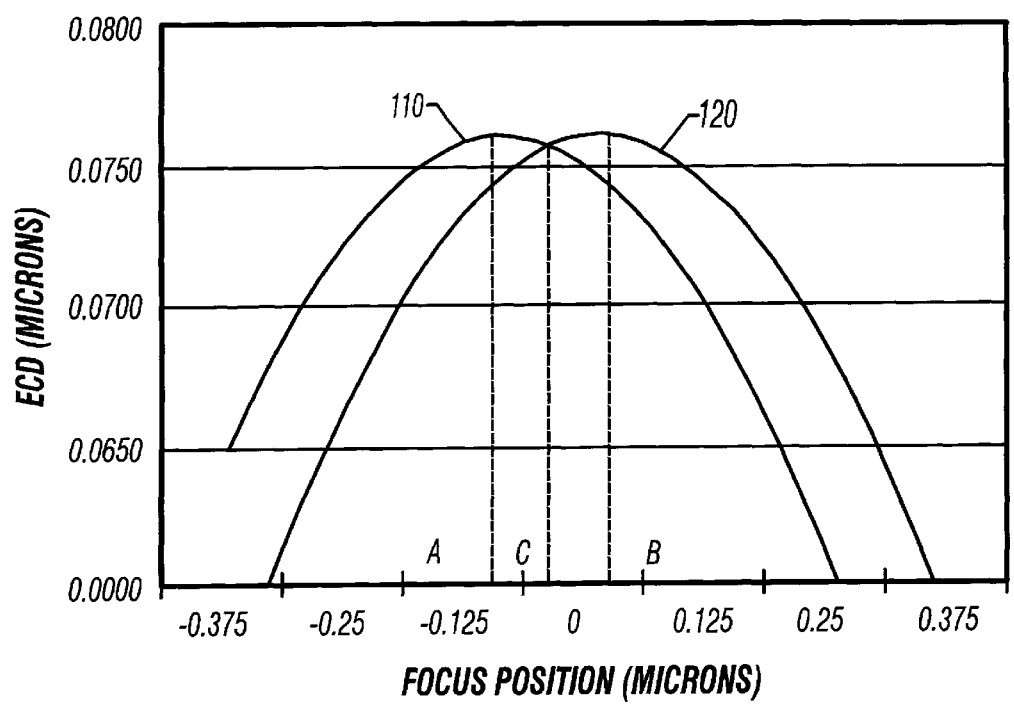
FIG. 1 shows measured imaged linewidths in a lens system over a range of focus positions for adjacent lines of the same linewidth orientated along orthogonal orientations in the imaging plane for a single scan column region for a scan lens, where the lens system exhibits astigmatism.

The techniques of the present disclosure include methods of quantitatively measuring the focus position of an imaging system on the imaging surface based on astigmatism of a lens system. Such measurements can be used to determine whether the blurring of the image caused by the focus error of the lens system is acceptable for a specific imaging application and to evaluate or improve the performance of the focus control module of the imaging system. The measurements can also be used to determine the flatness of an imaging surface.

Astigmatism is a lens aberration which induces a focus difference between two orthogonal directions in the image of a lens system. A lens can have such an aberration if the geometrical shape of the lens is not rotationally symmetric with respect to its optic axis. Even if a lens is virtually symmetric, astigmatism may still exist in the image of an object point that is off the optical axis of the lens system. In general, many lens systems inherently have some degree of residual astigmatism within acceptable levels when efforts are made in the lens design and fabrication to reduce astigmatism. According to the present techniques, this astigmatism can be beneficially used to determine focus position of the lens system and hence to monitor focus errors in the imaging system.

According to this disclosure, the amount of astigmatism of a given lens system can be characterized by measuring the difference in linewidth between two imaged features in a patterned mask of identical design linewidths in two orthogonal orientations within the image as a function of the focus position. The two imaged features may be line features of a common design width in two orthogonal orientations in the mask. They may be spatially separate from each other or partially in contact with each other. The two imaged features in the mask are imaged onto the imaging plane through the same region of the lens system. Hence, the amount of astigmatism of this region of the lens is determined and is subsequently used to determine the focus position. The amount of astigmatism of other regions of the lens can be similarly characterized.

The present invention can be adapted to monitor the focus error in a scanning imaging system that uses a scan lens for photolithography. In such a scanning system, the lens system is kept stationary during photo exposure. A mask with desired circuit patterns, and a substrate in the imaging plane, are scanned relative to the stationary lens system to print patterns onto the substrate. The patterns on the mask are imaged through the same region of the lens system.

The linewidth of an imaged feature in an imaging plane at a given focus position can be independently measured by a suitable technique. For example, the technique of measuring electrical critical dimensions ("ECDs") may be used to measure the linewidth of a conductive line element formed from an imaged feature on a semiconductor wafer based on an electrical property such as resistance.

In each of the orthogonal orientations, the linewidth of an imaged feature in the imaging plane varies with the distance, often referred to as defocus, between a focus position and the optimum focus position of the lens system. This variation is nonlinear in general and is usually symmetric with respect to the optimum focus position as illustrated in FIG. 1. According to the present invention, the relationship between the imaged linewidth and the focus position can be measured in either of the two orientations that are orthogonal to each other.

FIG. 1 shows measured ECDs for two orthogonal ECD line features in a photomask that are close to each other as a function of the focus position of a lens. The ECD line features are imaged onto a positive photoresist on a wafer surface. Curves 110 and 120 represent the measured relationships between the ECDs and the respective focus positions corresponding to horizontal and vertical orientations in the lens, respectively.

At each focus position, linewidths of the images of two adjacent line features that are orthogonal to each other are measured. The two measured orthogonal line features in the imaging surface may be spatially adjacent to or in contact with each other within the area of interest. They may also partially overlap with each other or be separate apart within the area of interest. When the amount of defocus of the entire imaging plane is measured, the two orthogonal line features may be located anywhere within the imaging plane, either adjacent to each other or separate apart. When the amounts of defocus in different areas within the same imaging surface are to be measured, two orthogonal line features in each area should be measured. The maximum spacing between the two orthogonal line features of an imaging area is limited by the boundary of the area.

In the horizontal orientation, the optimum focus position is indicated by a position A at which the linewidth of the feature image is maximum. As the focus position deviates from the position A, the linewidth of the feature image in the horizontal orientation decreases as the imaging resolution and fidelity deteriorate. In the vertical orientation, the optimum focus position is at a different position B. Each curve is substantially symmetric with respect to its optimum focus position. Curves 110 and 120 intercept with each other at a focus position C between positions A and B, where effects of defocus on the formed images in both orientations are equal. The difference in linewidth between the two curves 110 and 120 at each focus position is called the delta for that focus position. This delta is a characteristic of the astigmatism for the given region of the lens that is used to generate the data depicted in FIG. 1.

Figure 2:
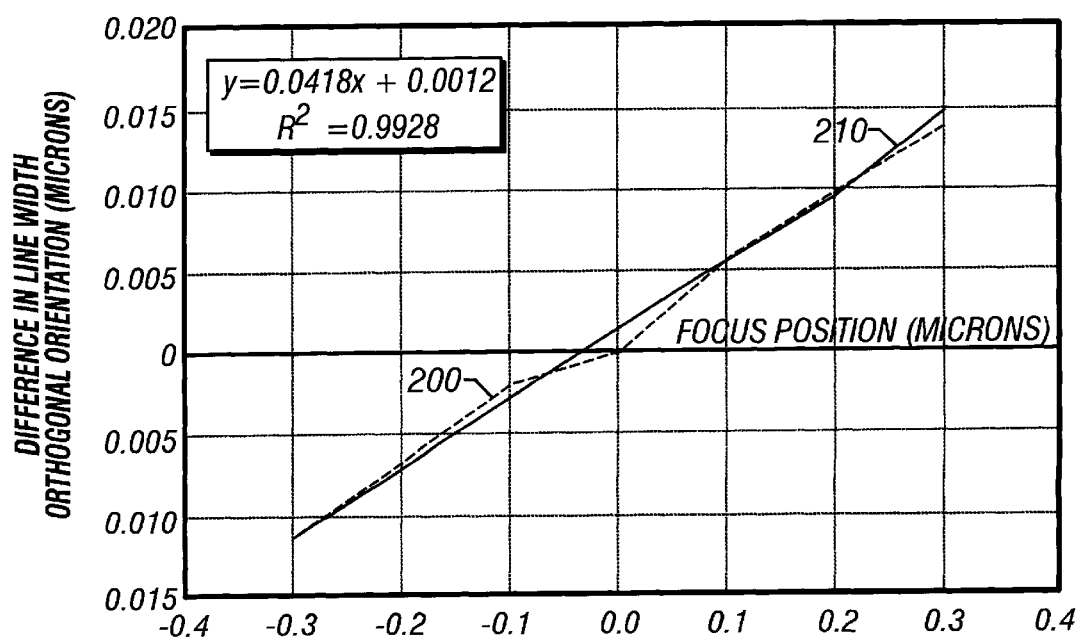
FIG. 2 shows a plot of measured differences in the imaged linewidths between the adjacent lines of the same design linewidth in orthogonal orientations at each focus position over the range of focus positions for the lens system shown in FIG. 1.

FIG. 2 is a plot of the measured differences in linewidth between the two adjacent line features of the two orthogonal orientations in the image plane deduced from the ECD data shown in FIG. 1, over the range of focus positions also depicted in FIG. 1. The data points in FIG. 2 that are connected by the dashed line 200 correspond to the difference in imaging linewidths between the orthogonal orientations shown in FIG. 1 over the range of focus positions. Remarkably, this difference was observed to be a monotonic function of the focus position so that each value in the difference in linewidth is fairly associated with a single focus position. Therefore, this monotonic function, if known, can be used to determine a focus position for a given difference in linewidth of orthogonal line features.

In a given lens system, the degree of the lens astigmatism for a given region of the lens system can be quantified by the slope of this monotonic function. The greater the slope in a given plot of the delta as a function of focus position, the greater is the degree of astigmatism for that portion of the lens. Conversely, the lesser the slope in a given plot of the delta as a function of focus position, the lesser is the degree of astigmatism for that portion of the lens. Hence, the presence of astigmatism of a lens system, when it is characterized according to the present disclosure, can function as a focus monitor for the lens system.

The monotonic relationship between the difference in linewidth of orthogonal line features and the focus position can be approximated by a polynomial curve fit within a certain range of focus positions. For example, the data points of measured differences in linewidth of FIG. 2 can be represented by the solid line 210 that was characterized with a least squares curve fit as y=0.0418x+0.0112. Remarkably, the value of the difference in linewidth between the two orthogonal orientations can be deduced as seen in FIG. 2, and the sensitivity of this technique can be below detection levels of a scanning electron microscope (SEM).

Figure 3A:
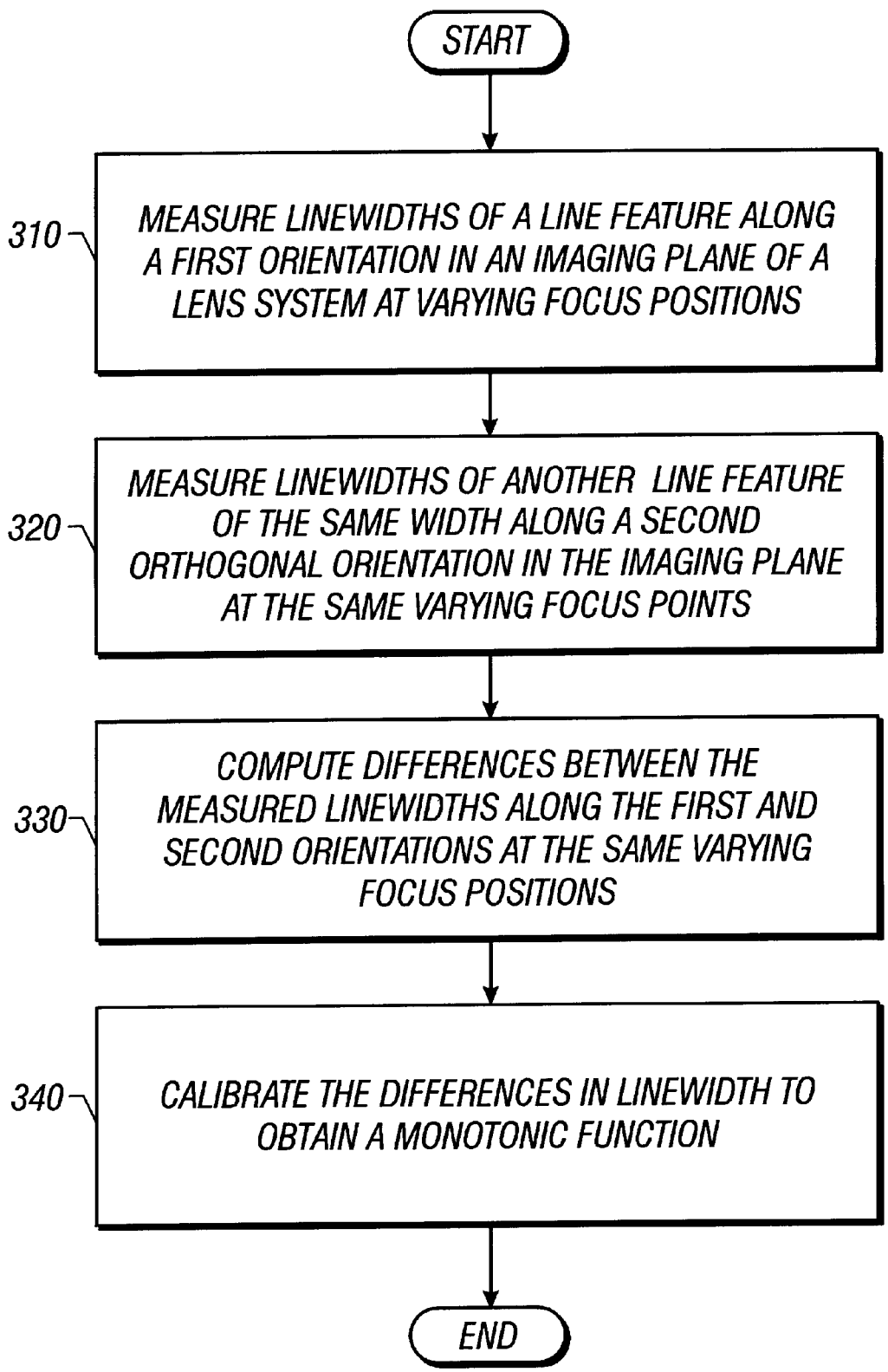
FIG. 3A is a flowchart for one embodiment of a method for characterizing astigmatism of a given portion of a lens for monitoring focus errors.

FIG. 3A is a flowchart showing one embodiment of the operational steps in characterizing astigmatism of a lens for monitoring focus errors. At steps 310 and 320, feature sizes of images of two orthogonal line features over a range of focus positions are measured, e.g., by using ECD as the source for obtaining astigmatism data of the portion of the lens that images the line features onto the imaging plane. At step 330, the measured feature sizes in the orthogonal orientations at each focus position are subtracted from each other to obtain the difference in linewidth as a function of focus position. The measured differences are then correlated at step 340 by determining the monotonic relationship that was discovered to exist between the differences in linewidth and their respective focus positions. A nonlinear or linear polynomial fit may be used to approximately represent the monotonic relationship.

Figure 3B:
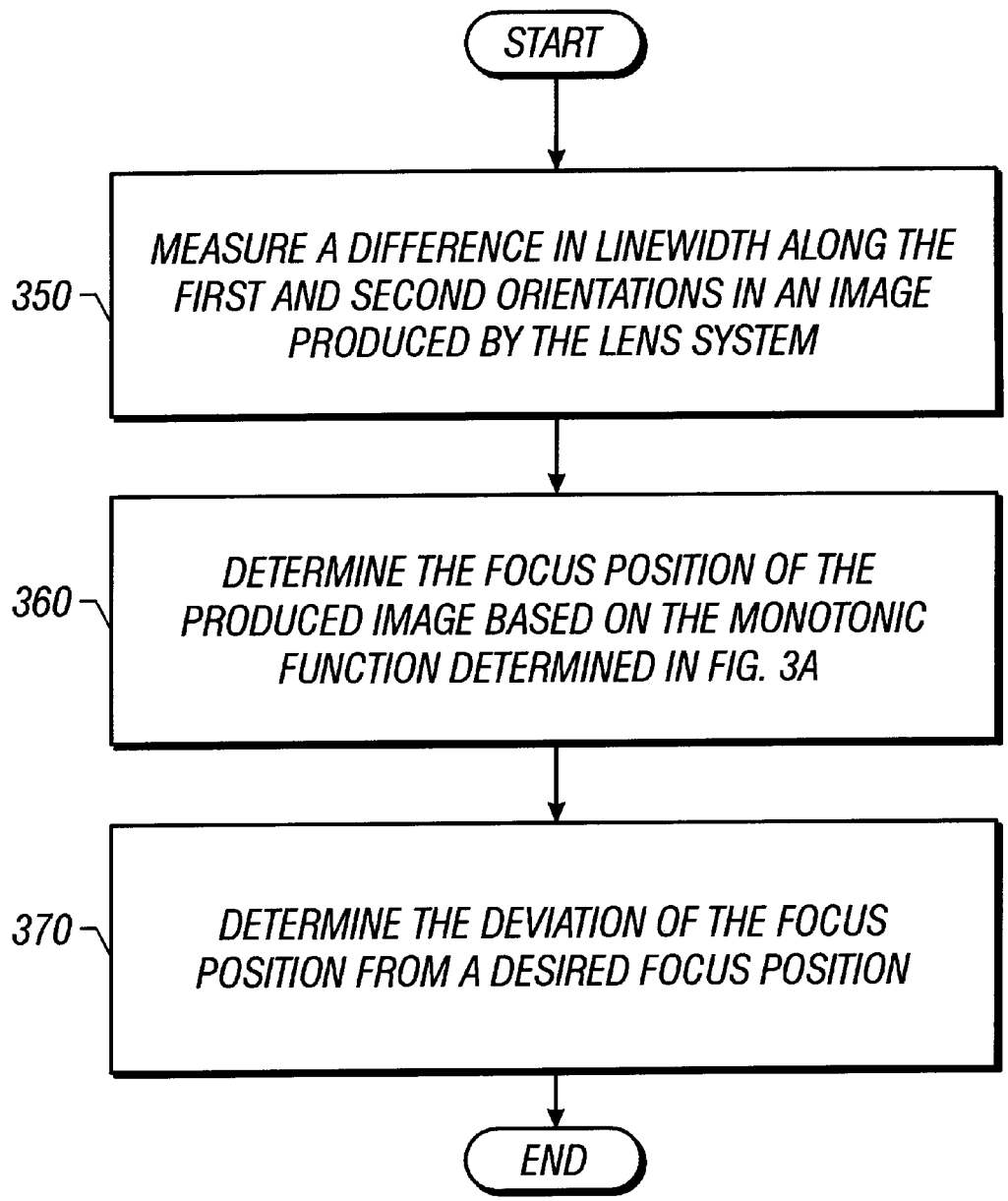
FIG. 3B is a flowchart for one embodiment of the operational steps for using astigmatism to monitor focus errors based on the characterization shown in FIG. 3A.

The above monotonic relationship between the delta in linewidth and the focus position can then be used to monitor focus errors in each image the lens system produces through the calibrated portion of the lens. FIG. 3B is a flowchart for one embodiment of the operational steps for using astigmatism to monitor focus errors. At step 350, two orthogonal line features in an image produced by the lens system through the portion as calibrated in FIG. 3A are measured to obtain their linewidths and the corresponding difference in linewidth is determined. Next at step 360, the calibrated monotonic relationship obtained as in FIG. 3A is then used to determine the corresponding focus position. This focus position is subsequently compared to a desired focus position, such as the focus position C in FIG. 2, to obtain the focus error or the amount of defocus (step 370). When the steps in both FIGS. 3A and 3B are sequentially carried out, a focus error of an imaging system can be determined even when the amount of astigmatism of the lens is initially unknown.

When the above method is used to monitor the focus error in photolithography for wafer processing, the measurements for the step 350 of FIG. 3B in measuring astigmatism in an image are usually done as part of an acceptance test and to monitor the performance of the imaging system. Hence, no special measurements are needed to implement the focus monitor based on astigmatism. This feature reduces the cost of implementation and simplifies the operation of the focus monitor. Once a lens system is calibrated, the focus monitoring can be done automatically and electronically by computing the focus position and the amount of defocus based on the data from the acceptance or monitor tests.

Figure 4:
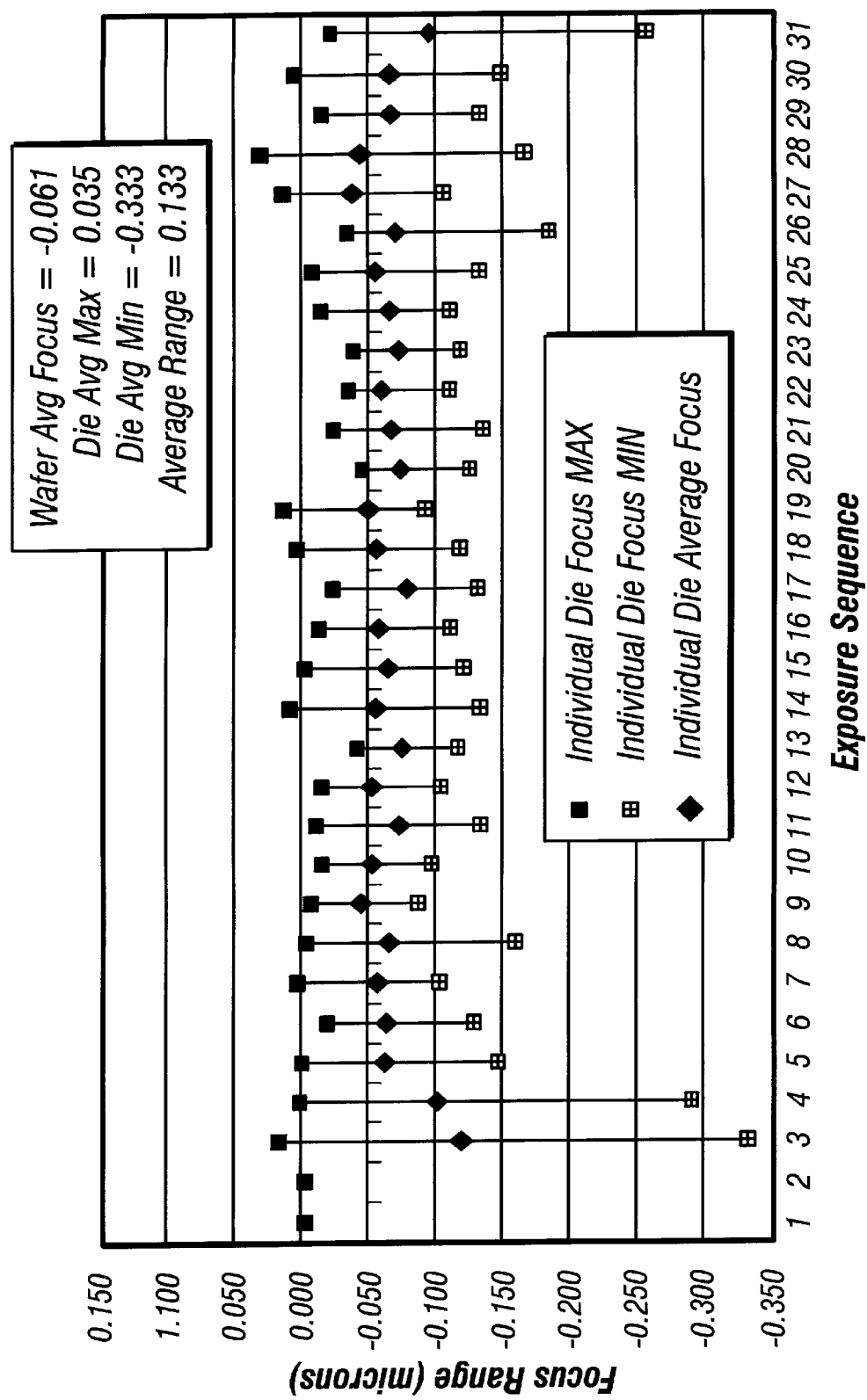
FIG. 4 shows measured defocus at different die on a wafer in a photolithographic imaging process by using the focus monitor based on astigmatism.

FIG. 4 shows the measured focus range for a sequence of exposures at thirty-one dice in a wafer by using the above focus monitor based on the presence of astigmatism. For each individual die, the maximum defocus, minimum defocus, and the average defocus can be determined. In addition, the focus characteristics across the entire wafer can be determined, such as the average defocus of all die on the wafer and the range of die average defocus. Such detailed focus information provides useful diagnostics data for the focus performance of the imaging system.

The focus monitor method based on astigmatism may be used for measurements other than monitoring focus. For example, a lens system calibrated according to the present techniques may be used to determine the flatness of a surface by monitoring the focus error caused by the waviness of the surface. A surface, e.g., a semiconductor wafer, can be placed at a known focus position for the calibrated lens of an imaging system. The known focus position may be the position where the difference in linewidth of two adjacent line features of the same design linewidth along two orthogonal orientations is zero. At this focus position, the effects of astigmatism on an image are substantially equal along the orthogonal orientations.

The surface may be divided into various fields to determine the surface variation from one field to another according to the present techniques. An image with orthogonal line features of the same design width is projected to each and every field on the surface through the same portion of a lens that has been calibrated according to FIG. 3A. The amount of difference in linewidth in each field can be measured to determine the amount of focus error within each field. The measured focus error in each field can include two different contributions, one from the focus error caused by the imaging system, and another from the surface waviness of the wafer under test. When the focus error caused by the imaging system is known or can be determined, the focus error solely caused by the surface waviness of the wafer can be determined to indicate the deviation from flatness of the wafer. As an example, the measured data of defocus on the wafer surface shown in FIG. 4 can be processed to represent the wafer flatness.

Although only a few embodiments are disclosed, other modifications and variations are possible without departing from the scope of the following claims.

What is claimed is:

1. A method for characterizing astigmatism of a lens system to determine a focus position, comprising:
   measuring imaged linewidths of a first line feature along a first orientation in a mask projected by a lens system at varying focus positions;
   measuring imaged linewidths of a second line feature along a second orientation orthogonal to said first orientation in said mask projected by said lens system at said varying focus positions, wherein said first line feature has an identical design width to said second line feature;
   subtracting measured linewidths to obtain a difference in linewidth at each focus position; and
   representing differences in linewidth and their respective focus positions by a function.

2. A method as in claim 1, further comprising imaging both said first line feature and said second line feature in said mask through a given region of said lens system onto said varying focus positions.

3. A method as in claim 1, further comprising:
   measuring a difference in linewidth of images in an imaging surface projected from two orthogonal line features of an identical design width by said lens system; and
   using said difference in linewidth to determine a focus position of the imaging surface based on said function.

4. A method as in claim 1, wherein said imaged linewidths of said first and second line features are measured based on an electrical property of conductive elements formed on a semiconductor wafer.

5. A method for determining a focus position of an imaging system, comprising:
   determining a difference in linewidth of images in an imaging surface projected from two line features of an identical design width in two orthogonal orientations by a lens system with astigmatism; and
   determining a focus position of the imaging surface based on a relationship between the difference in linewidth and the focus position.

6. A method as in claim 5, wherein the relationship is determined by:
   measuring linewidths of two line features in orthogonal orientations at a plurality of focus positions;
   subtracting measured linewidths of the two line features at each focus position to obtain a difference in linewidth at each focus position; and
   representing differences in linewidth and their respective focus positions by a function.

7. A method as in claim 6, wherein a linewidth is measured based on an electrical property of a conductive element formed from an image on a semiconductor wafer.

8. A method as in claim 6, wherein the function is monotonic, and each difference in linewidth corresponds to a single focus position.

9. A method as in claim 8, wherein the function is a linear polynomial curve fit of the differences in linewidth and their respective focus positions.

10. A method as in claim 8, wherein the function is a nonlinear polynomial curve fit of the differences in linewidth and their respective focus positions.

11. A method as in claim 5, further comprising comparing the focus position to a desired focus position to determine an amount of defocus.

12. A method as in claim 11, wherein the desired focus position is a position at which the measured linewidths along orthogonal orientations are substantially equal.

13. A method as in claim 5, wherein the two line features are spatially separate from each other or partially in contact with each other.

14. A method for monitoring focus of a lens system, comprising:

measuring imaged linewidths of a first line feature along a first orientation in an imaging plane of a lens system at a plurality of focus positions;

measuring imaged linewidths of a second line feature of a design linewidth identical to a design linewidth of the first line feature, the second line feature being along a second orientation orthogonal to the first orientation in the imaging plane at the plurality of focus positions;

subtracting imaged linewidths that are measured along the first and second orientations to obtain differences in linewidth at the plurality of focus positions;

forming a monotonic function of the differences in linewidth with respect to focus positions;

measuring a difference between linewidths of two orthogonal line features of the same linewidth in an image produced by the lens system; and determining a respective focus position of the image according to the monotonic function and determining a position difference between the respective focus position and a desired focus position.

15. A method as in claim 14, wherein the monotonic function is a linear function.

16. A method as in claim 14, wherein the monotonic function is a nonlinear function.

17. A method as in claim 14, wherein the desired focus position is a position at which measured linewidths of two orthogonal line features of the same linewidth are substantially equal.

18. A method as in claim 14, wherein the lens system includes a single lens.

19. A method of determining flatness of a wafer, comprising:

calibrating a lens system that exhibits astigmatism to determine a monotonic functional dependence of differences in linewidth of two orthogonal line features of the same linewidth with respect to focus positions;

placing a surface of a wafer at a known focus position to receive an image produced by the lens system;

measuring a difference between linewidths of two line features of the same linewidth in the image on the surface;

using the monotonic functional dependence of differences to determine a measured focus position; and determining a difference between the measured focus position and the known focus position to indicate the flatness of the surface.

20. A method as in claim 19, further comprising:

changing a relative position of the surface and the lens system in a direction perpendicular to an optic axis of the lens system to at least another position to receive the image at a different location on the surface;

measuring another difference between linewidths of two line features of the same linewidth in the image on the surface; and using the dependence to determine another measured focus position and hence the flatness of the different location.

21. A method as in claim 19, wherein the known focus position is a position where an image is substantially equally distorted by astigmatism of the lens system.

22. A method as in claim 19, wherein the dependence is linear.

23. A method as in claim 19, wherein the dependence is nonlinear.

* * * * *